(12) United States Patent
Hsieh

(10) Patent No.: US 6,228,711 B1
(45) Date of Patent: May 8, 2001

(54) METHOD OF FABRICATING DYNAMIC RANDOM ACCESS MEMORY

(75) Inventor: Yong-Fen Hsieh, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/451,426

(22) Filed: Nov. 30, 1999

(51) Int. Cl.⁷ .................................................. H01L 21/8242
(52) U.S. Cl. ............................................ 438/255; 438/633
(58) Field of Search .................................... 438/253, 255, 438/396, 398, 633, 964

(56) References Cited

U.S. PATENT DOCUMENTS 5,597,756 * 1/1997 Fazan et al. ........................ 438/964
5,763,286 * 6/1998 Figura et al. ....................... 438/255
5,981,334 * 11/1999 Chien et al. ........................ 438/255

* cited by examiner

Primary Examiner—Chandra Chaudhari

(57) ABSTRACT

The present invention is a method of fabricating a dynamic random access memory. The node contact opening and the capacitor opening are combined in a step of the dual damascene opening process during the capacitor formation. The bottom of the capacitor is embedded in the dual damascene opening. The conducting layer used for forming the bottom plates is polished by chemical mechanical polishing to form the bottom plates that are separated each other. Therefore, patterning of bottom plate by photolithography and etching is not necessary in the present invention.

20 Claims, 15 Drawing Sheets

METHOD OF FABRICATING DYNAMIC RANDOM ACCESS MEMORY

BACKGROUND OF THE INVENTION

1. Field of the Invention

The invention relates to a method of fabricating a semiconductor device. More particularly, the present invention relates to a method of fabricating a dynamic random access memory.

2. Description of the Related Art

In the process of fabricating dynamic random access memory, every dynamic random access memory cell includes a field effect transistor and a capacitor, and the process requires a the bit lines to connect to the source/drain of the field effect transistors and an interconnect. Therefore, the processes for fabricating DRAM is more complicated than the process for fabricating other semiconductor devices, and the factors to be considered are also more numerous in the process integration.

As highly integrated devices are required, the device size is scaled down to fulfill design requirements. In other words, the result of devices requiring high integration reduces the space available for capacitor formation. On the other hand, computer software is gradually becoming huge, and more memory capacity is required. In the case where it is necessary to have a smaller size with sufficient memory capacity, the conventional method of fabricating the DRAM capacitor has to change in order to fulfil the requirements of the trend.

It is thus necessary to find a method that increases the present surface area of the storage node of the capacitor to increase its capacitance, while still reducing the size of the capacitor. The stacked-type capacitor is one kind of DRAM structure for increasing capacitance. There are two main types of stacked-type capacitors, which are classified by the relative position of the bit lines and capacitors. The one is the bit line over capacitor type, while the other is capacitor over bit line type.

FIG. 1 is schematic, cross-sectional view illustrating the structure of a bit line over capacitor (BOC) DRAM fabricated according to the prior art method. Referring to FIG. 1, field effect transistors 102 are formed on a substrate 100, and then capacitors 116 are formed by the conventional process. The storage nodes 110 connecting to source/drain 106 of the field effect transistors 102 are first formed, and then the top plates 114 are formed during capacitor formation. Certainly, before the top plates 114 are formed, the processes for forming a capacitor include a step of forming a capacitor dielectric layer 112 between the storage node 110 and the top plates 114. The bit lines 118 are formed after the capacitors 116 are formed. The bit lines 118 are connected to another source/drain 108 of the field effect transistor 102 by bit line contacts 120.

FIG. 2 is schematic, cross-sectional view illustrating the structure of a capacitor over bit line (COB) DRAM fabricated according to the prior art method. Referring to FIG. 2, field effect transistors 202 are formed on a substrate 200, and then bit lines 204 are formed that connect to source/drain 206 of the field effect transistor 202. After the bit lines 204 are formed, capacitors 210 are formed, which are connected to another source/drain 208 by the storage nodes 212.

As high-density integration circuit is required, not only the device size but also the spaces between devices and devices are scaled down. The BOC and COB processes of conventional DRAM are complicated, and require repeated photolithography and etching steps. Therefore, the process capability is limited in lithography accuracy and etching capability.

The processes for forming the above-mentioned BOC-type DRAM as shown in FIG. 1 must have a high degree of lithography accuracy between the gates 104 (word lines) of the field effect transistors 102 and the storage nodes 110, between the bit line contacts 120 and the top plate 114 of the capacitor 116, or between the two storage nodes 110. If misalignment occurs during the process, the devices will suffer bridging.

Similarly, the processes for forming the COB-type DRAM as shown in FIG. 2 also gives rise to some problems as in the above-mentioned BOC-type DRAM. For example, the processes are subjected to the challenge of lithography accuracy between the gates 218 (word lines) and the bit line contacts 220 of the bit lines 204, between the gates 218 (word lines) and the storage node 212, or the two storage nodes 212. On the other hand, the capacitance of the storage node 212 depends on the effective contact areas between the storage node 212 and the capacitor dielectric layer 214. In the conventional process, the capacitance of a capacitor is increased by increasing the thickness of the storage nodes 212. However, after the device is integrated, the spaces of the two storage nodes 212 are reduced. The aspect ratio of the spaces between the two storage nodes 212 is increased as the thickness of the storage nodes 212 is increased. The storage nodes 212 are difficult to separate from each other during the patterning of etching process.

SUMMARY OF THE INVENTION

The present invention is a method of fabricating a dynamic random access memory. A substrate that has a gate thereon, a first source/drain and a second source/drain therein is provided. A first dielectric layer is formed over the substrate. A bit line is formed in the first dielectric layer and connects to the first source/drain. A planted second dielectric layer, a stop layer, a third dielectric layer and a protecting layer are sequentially formed over the substrate, and then a dual damascene opening is formed therein, wherein the dual damascene opening exposes the second source/drain. A first conformal conducting layer is formed, which covers the surface of the dual damascene opening and a surface of the protecting layer. A fourth dielectric layer is formed on the substrate, which fourth dielectric layer covers the first conformal conducting layer and fills the dual damascene opening. The conformal first conducting layer and the fourth dielectric layer on the surface of the protecting layer are polished with a chemical mechanical polishing process, using the protecting layer as a polishing stop layer. The fourth dielectric layer remaining in the dual damascene opening is removed, so that the first conformal conducting layer is exposed for use as a bottom plate of a capacitor. A capacitor dielectric layer is formed on the first conformal conducting layer. A second conducting layer that is used for a top plate of the capacitor is formed and patterned on the capacitor dielectric layer.

The present invention provides another method of fabricating a dynamic random access memory. A substrate that has a gate thereon, and a first source/drain and a second source/drain therein is provided. A first dielectric layer is formed over the substrate. A bit line is formed in the first dielectric layer and connects to the first source/drain. A planted second dielectric layer, a stop layer, a third dielectric layer and a protecting layer are sequentially formed over the substrate, and a dual damascene opening is formed therein, wherein the dual damascene opening exposes the second source/drain. A first conformal conducting layer is formed, which covers a surface of the dual damascene opening and a surface of the protecting layer. A fourth dielectric layer is formed on the substrate, which fourth dielectric layer covers the first conformal conducting layer and fills the dual damascene opening. The conformal first conducting layer and the fourth dielectric layer on a surface of the protecting layer are polished with a chemical mechanical polishing process, using the protecting layer as a polishing stop layer. The protecting layer is removed. The fourth dielectric layer remaining in the dual damascene opening and the third dielectric layer is then removed, so that the first conformal conducting layer is exposed for use as a bottom plate of a capacitor. A capacitor dielectric layer is formed on the exposed first conformal conducting layer. A second conducting layer that is used for a top plate of the capacitor is formed and patterned on the capacitor dielectric layer.

In the present invention, the node contact opening and the capacitor opening is combined in a step of the dual damascene opening process during the capacitor formation. The bottom of the capacitor is embedded in the dual damascene opening. The conducting layer used for forming the bottom plates is polished by chemical mechanical polishing to form the bottom plates that are separated each other, so that patterning of bottom plate by photolithography and etching is not necessary in the present invention. The problems, for example, misalignment arising from photolithography, can be avoided. The difficult etching problem due to the conducting layer used for forming the bottom plate being too thick and the spaces of the bottom plate being narrow is resolved. The processes of the present invention are simplified, so that the present invention is more cost effective and has a higher yield potential. The layout rule of all capacitors related layers can be significantly relaxed, so that the present invention makes the high density array design and process control easy to attain.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
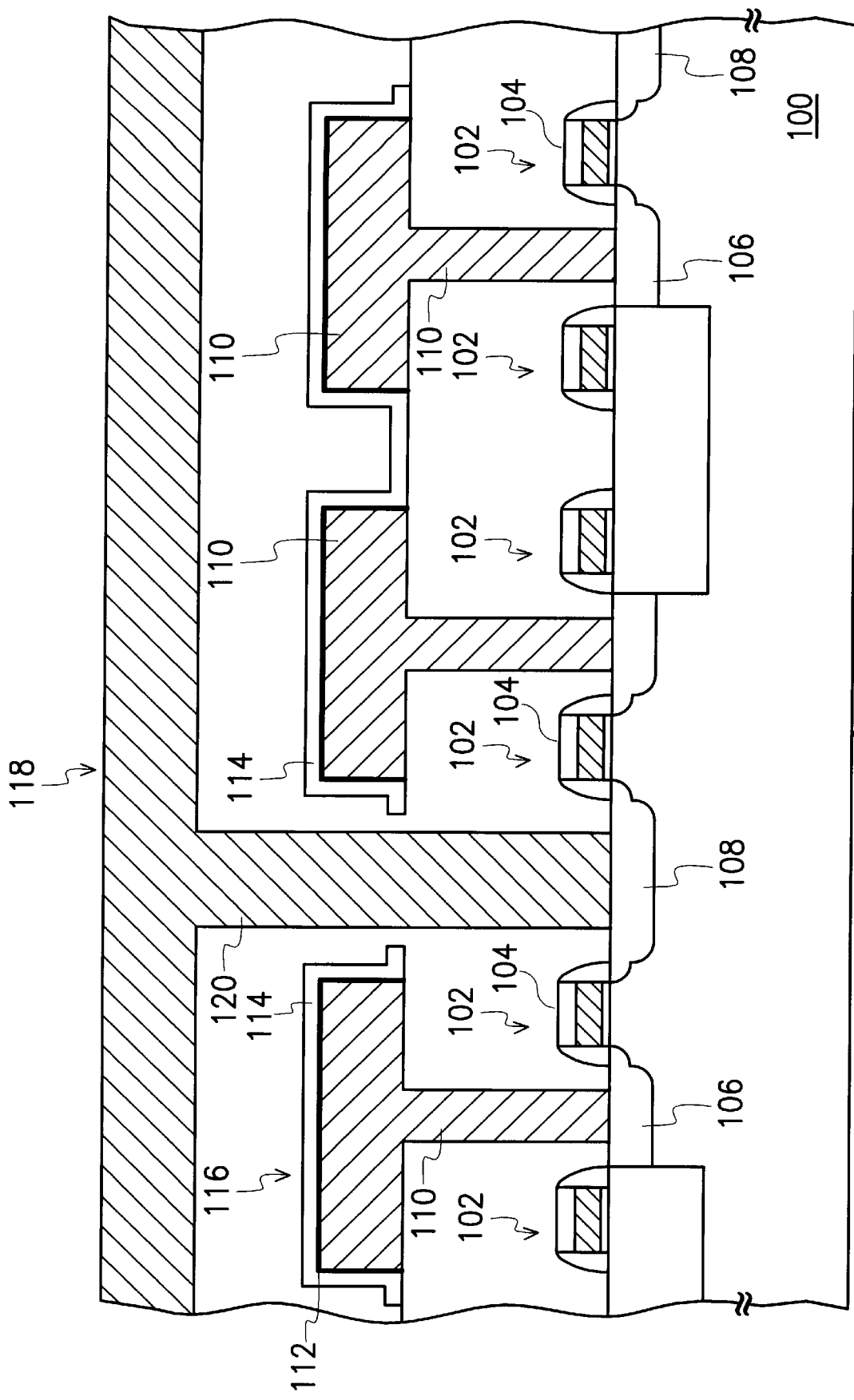
FIG. 1 is schematic, cross-sectional view illustrating the structure of a bit line over capacitor of DRAM fabricated according to the prior art method.
Figure 2:
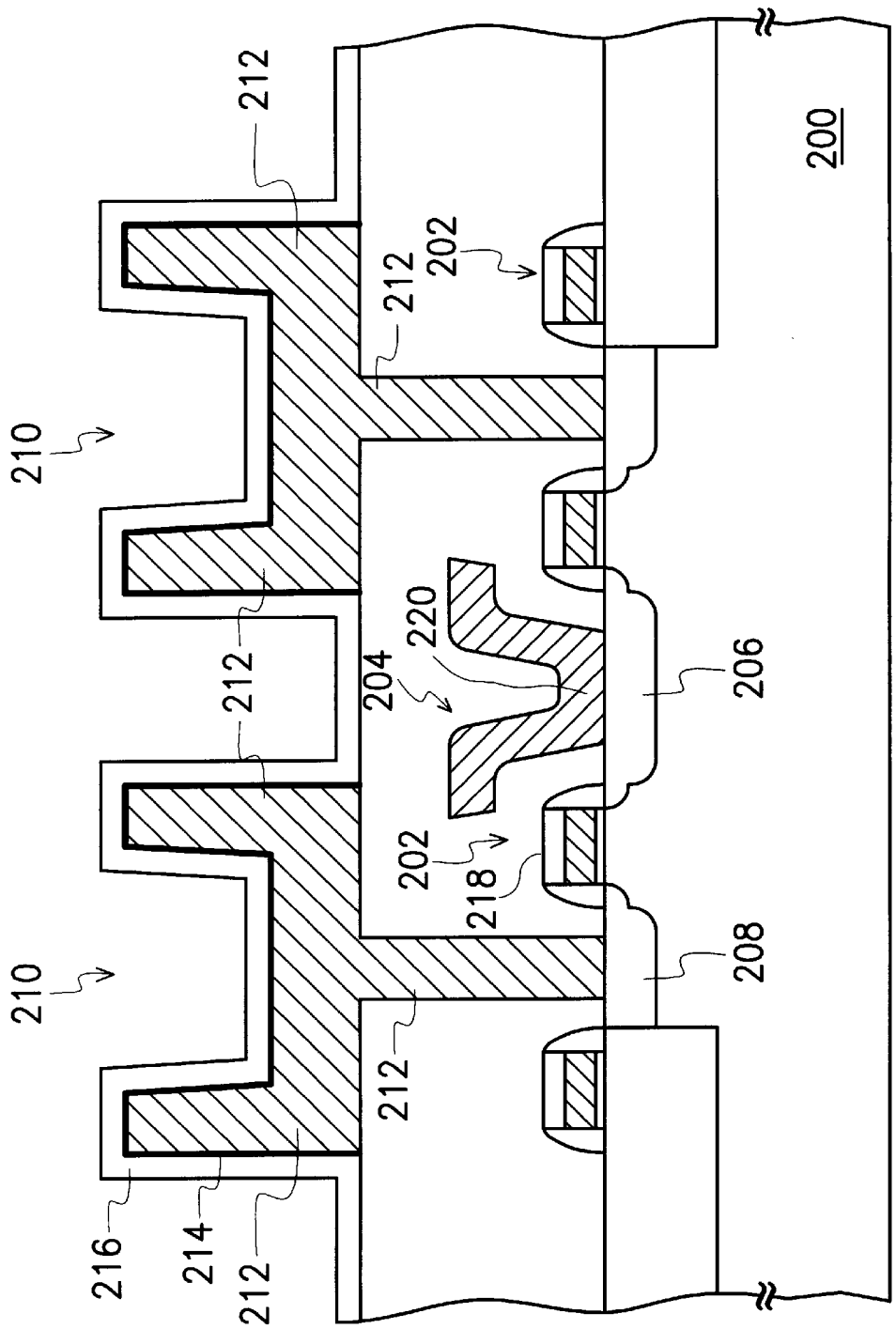
FIG. 2 is schematic, cross-sectional view illustrating the structure of capacitor over of bit line DRAM fabricated according to the prior art method.
Figure 3A:
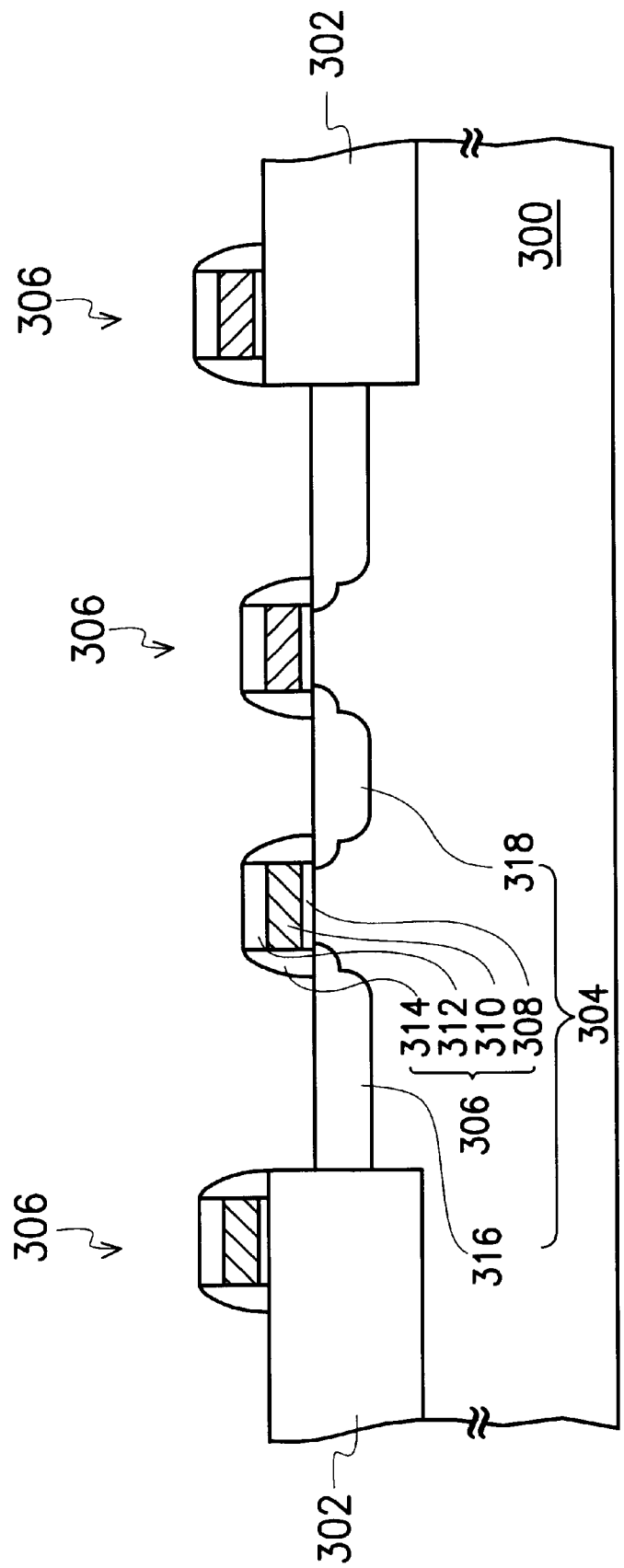
FIGS. 3A–3J are schematic, cross-sectional views illustrating a method of fabricating a DRAM according to the first preferred embodiment of the method according to the present invention.

Referring to FIG. 3A, isolation structures 302 are formed in a substrate 300 to define the active regions of the substrate 300. The isolation structure 302 is formed by local oxidation (LOCOS) or shallow trench isolation. Field effect transistors 304 are formed on the substrate 300. Each field effect transistor 304 includes a gate 306 and source/drain 316, 318.

Each gate 306 comprises a gate oxide layer 308, a conducting gate oxide layer 310, a cap layer 312 and spacers 314. The gate oxide layer 308 is formed by a thermal oxidation process to a thickness of about 40 Angstroms to about 140 Angstroms. A material of the conducting gate layers 310 includes doped polysilicon formed by, for example, chemical vapor deposition to a thickness of about 1000 Angstroms to about 2000 Angstroms. Another material of the conducting gate layers 310 comprises polycide, which is composed of a doped polysilicon layer and a silicide layer, both formed by chemical vapor deposition or metal. The cap layers 312 comprise silicon nitride formed by, for example, chemical vapor deposition or low-pressure chemical vapor deposition to a thickness of about 1500 Angstroms to about 2000 Angstroms. A material of the spacers 314 includes silicon nitride; silicon nitride layers are formed over the substrate by chemical vapor deposition and then an etch back process is performed to form the spacers 314.

The source/drain 316, 318 are formed by ion implantion to implant dopants into the substrate 300 while using the gates 306 and the isolation structure 302 as mask. The dopants comprise, for example, arsenic, phosphorous, and boron. Preferably, the source/drain 316, 318 comprise an extended source/drain under the spacers 314. The extended source/drain are formed by ion implantion to implant dopants into the substrate 300 before the spacers 314 are formed.

Figure 3B:
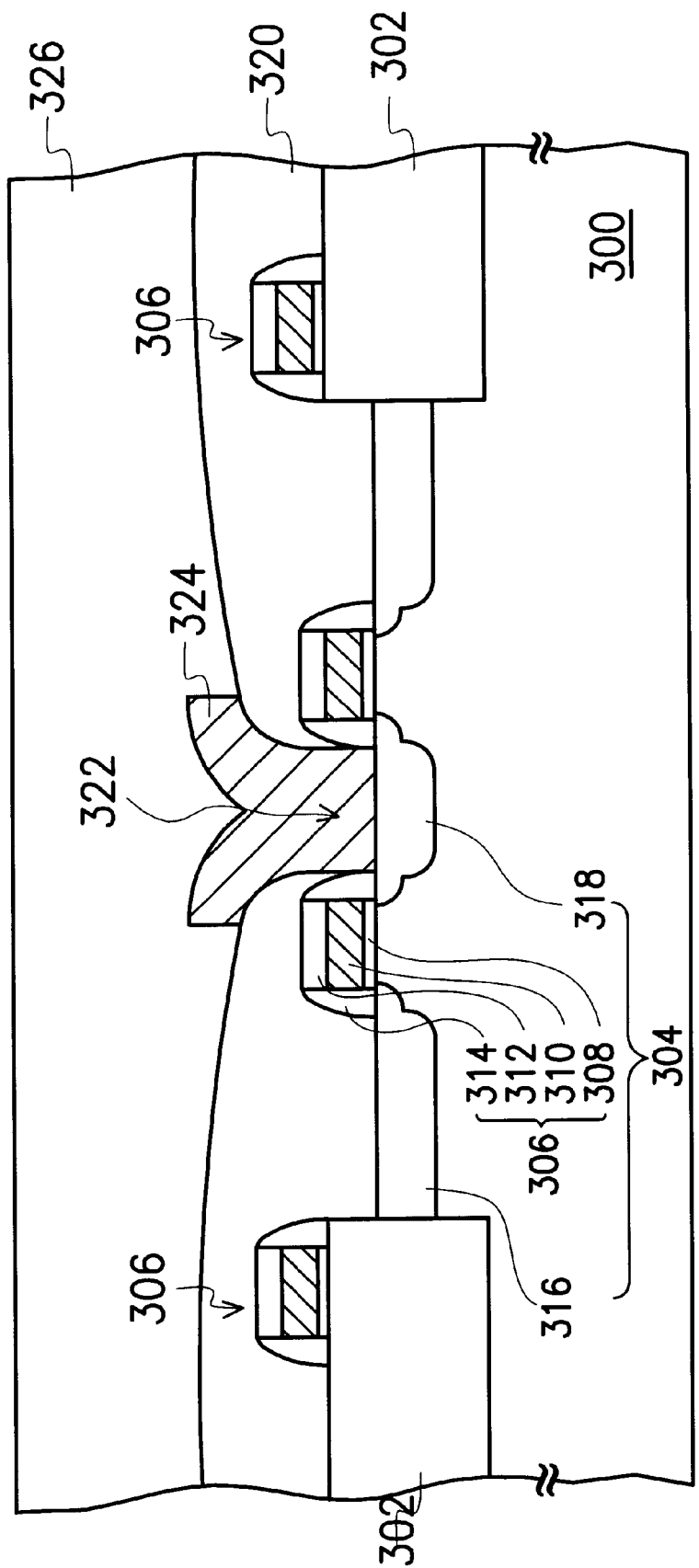

Referring to FIG. 3B, a dielectric layer 320 is formed over the substrate 300. A material suitable forming the dielectric layer comprises, for example, silicon oxide, phosphosilicate glass (PSG) or borophosphosilicate glass (BPSG) formed by chemical vapor deposition (CVD), or spin-on-glass formed by spin coating. The dielectric layer 320 is planarized by, for example, a chemical mechanical polishing process in order to provide a smooth surface for subsequent processes.

The bit line 324 is formed to connect to the source/drain 318. The methods of forming the bit line 324 comprises patterning the dielectric layer 320 to form bit line contact openings 322 using photolithography and etching, and then covering the dielectric layer 320 and filling the bit line contact opening 322 with a conducting layer. The conducting layer is patterned by photolithography and etching, so that the bit line 324 is completely formed. The material of the conducting layer used for forming the bit line 324 comprises doped polysilicon, or polycide which comprises polysilicon and silicide. The doped polysilicon is formed by chemical vapor deposition, while the silicide comprises tungsten silicon formed by, for example, chemical vapor deposition or sputtering.

Another dielectric layer 326 is formed over the substrate 300, and then it is planarized. A material of the dielectric layer 326 comprises silicon oxide formed by chemical vapor deposition. The preferable method of planarization includes a chemical mechanical polishing process.

Figure 3C:
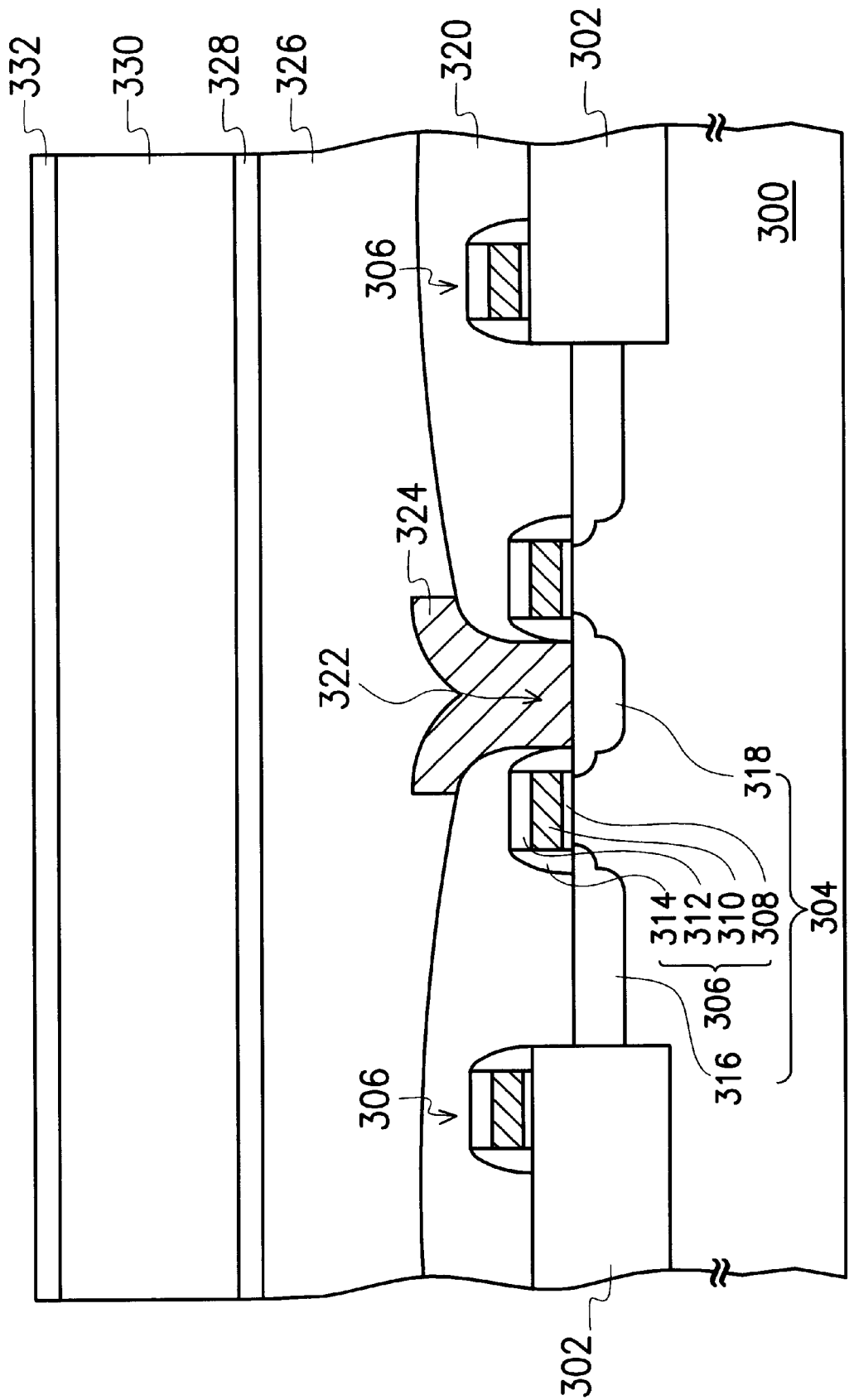

Referring to FIG. 3C, a stop layer 328, a dielectric layer 330 and a protecting layer 332 are sequentially formed over the substrate 300. The stop layer 328 has an etching rate that is different from the etching rates of the dielectric layer 330, 326 and 320. A material of the stop layer 328 comprises, for example, silicon nitride formed by chemical vapor deposition, low-pressure chemical vapor deposition and atmospheric pressure chemical vapor deposition to a thickness of about 300 Angstroms to about 500 Angstroms. The dielectric layer 330 has an etching rate that is different from the etching rates of the protecting layer 332 and the stop layer 328. A material of the dielectric layer 330 is, for example, silicon oxide formed by chemical vapor deposition or low-pressure chemical vapor deposition. Thickness of the dielectric layer 330 depends on the needed capacitance of the capacitor, for example, about 4000 Angstroms to about 5000 Angstroms. The protecting layer 332 has an etching rate that is different from the etching rate of the dielectric layer 330. The protecting layer 332 has a polishing rate that is different from the polishing rate of a conducting layer formed in subsequent processes which is used for forming a bottom plate of the capacitor. A material of the protecting layer 332 comprises, for example, silicon nitride formed by chemical vapor deposition, low-pressure chemical vapor deposition and atmospheric pressure chemical vapor deposition to a thickness of about 300 Angstroms to about 500 Angstroms.

Figure 3D:
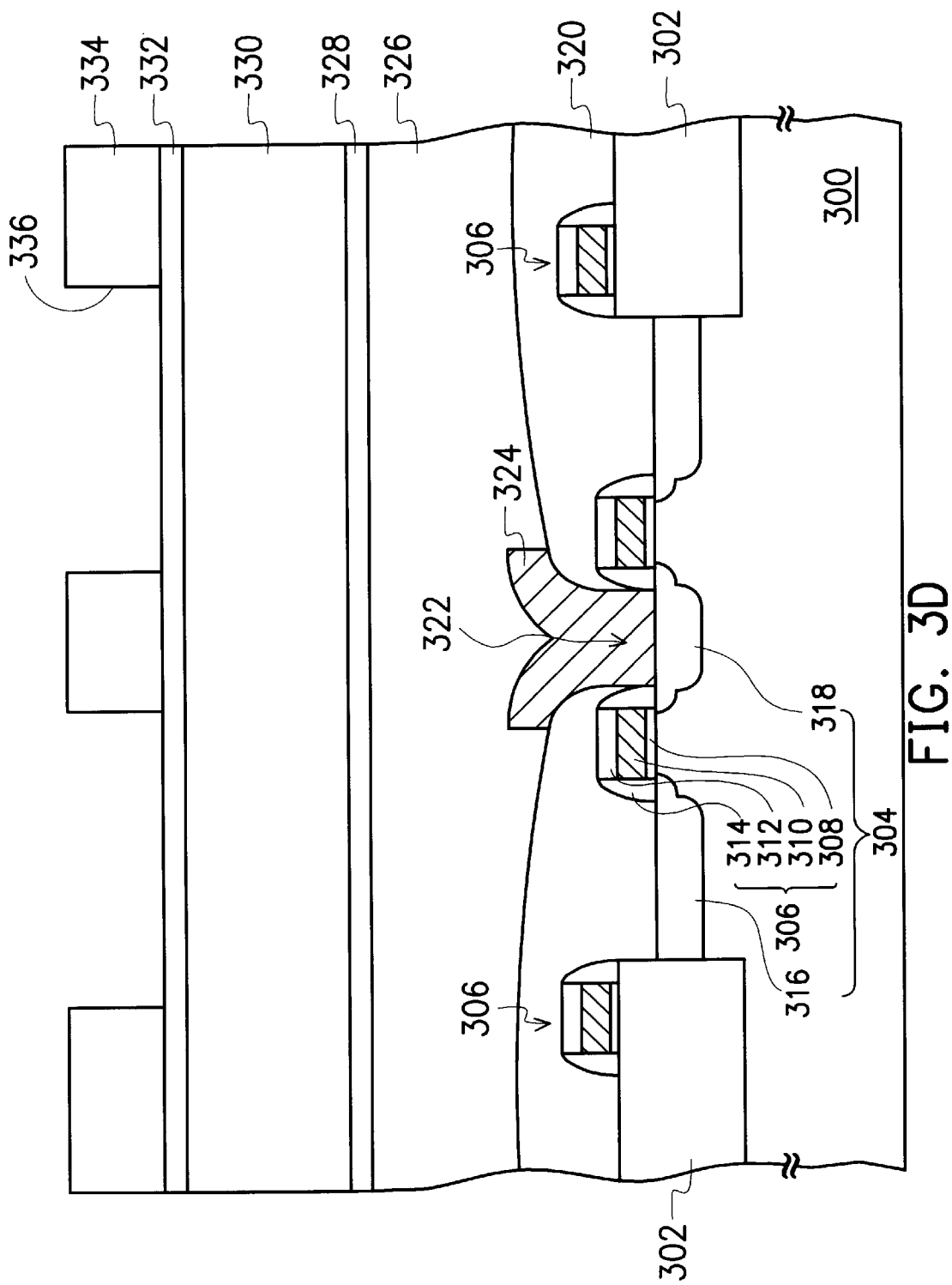
Figure 3E:
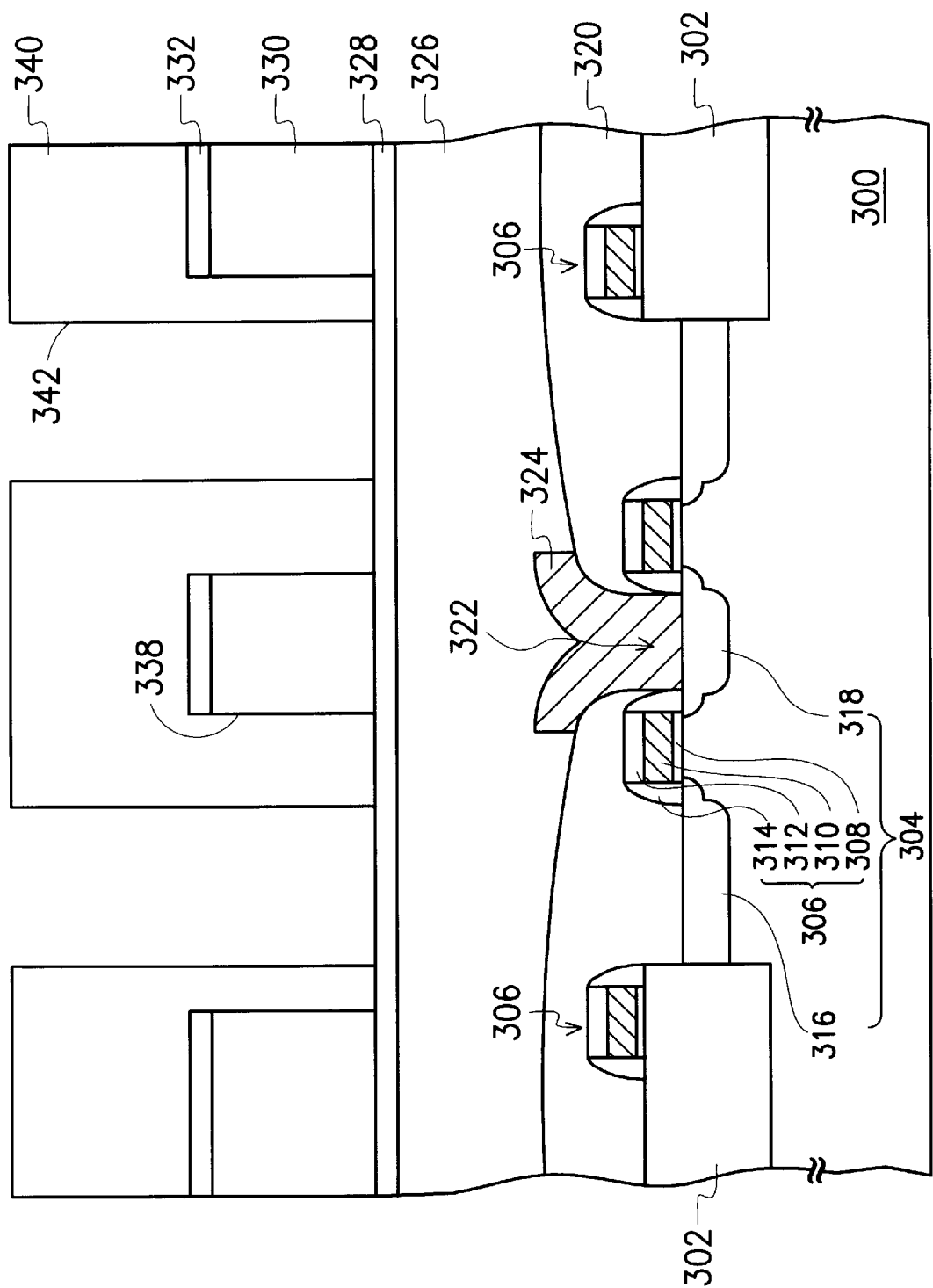
Figure 3F:
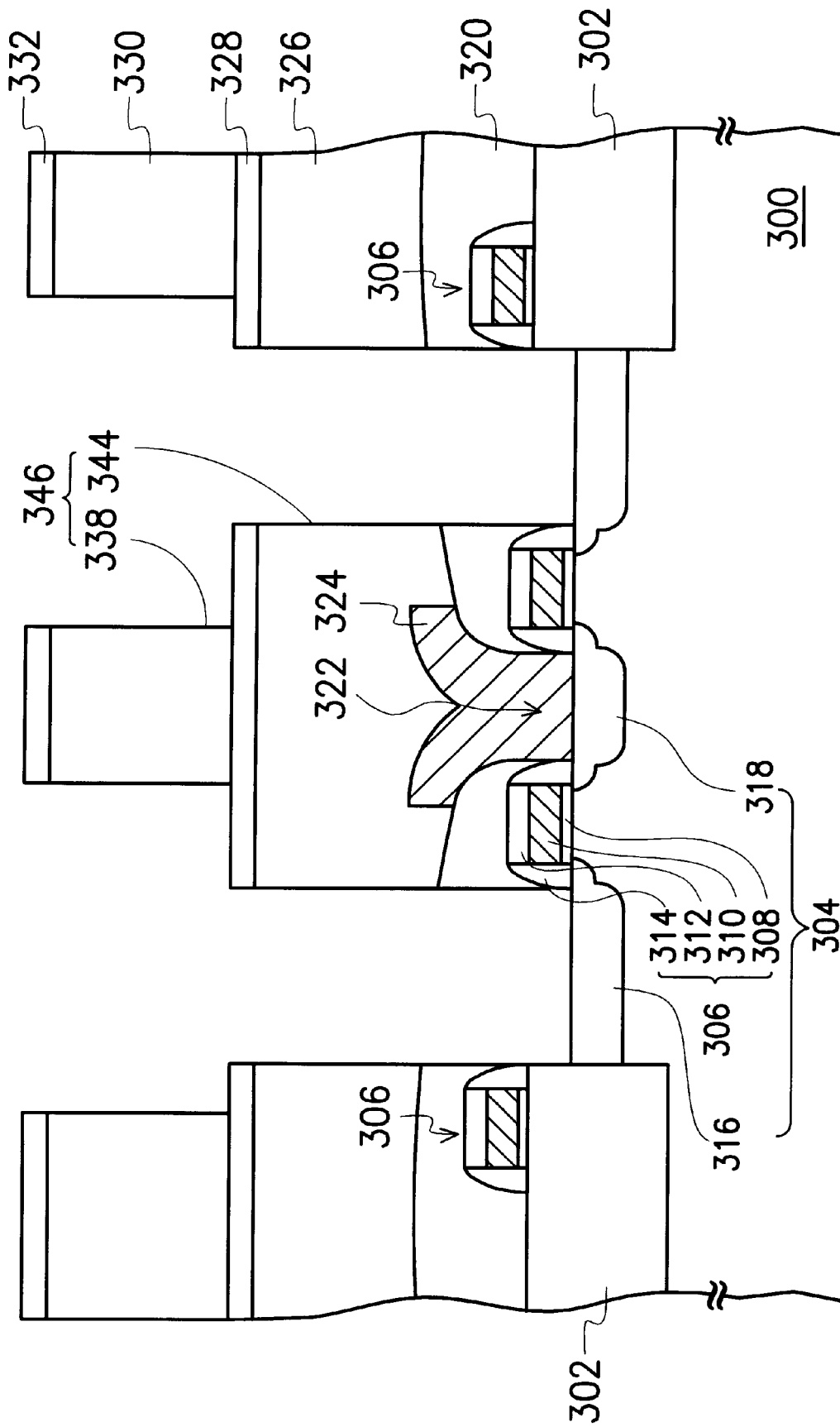

Referring forward to FIG. 3F, a dual damascene opening 346 exposing the source/drain 316 is formed in the protecting layer 332, the dielectric layer 330, the stop layer 328, the dielectric layer 326 and the dielectric layer 320. The dual damascene opening 346 is composed of a capacitor opening 338 which is formed in the protecting layer 332 and the dielectric layer 330, and a node contact opening 344 which is formed in the stop layer 328, dielectric layer 326 and the dielectric layer 320.

A method of forming the dual damascene opening 346 is, for example, the process shown in FIGS. 3D–3F.

Referring to FIG. 3D, a mask layer 334 is formed over the protecting layer 332, which has an opening 336 therein used for defining the pattern of the capacitor opening 338 over the source/drain 316. A material of the mask layer 334 comprises photoresist.

Referring to FIG. 3E, the exposed protecting layer 332 and the dielectric layer 330 underneath are removed by, for example, reactive ion etching using the mask layer 334 as etch mask, to form the capacitor opening 338.

Another mask layer 340 formed by, for example, photoresist is formed over the substrate 300 after the mask layer 334 is removed. The mask layer 340 has an opening 342 that is used for defining the pattern of the node contact opening 344 over the source/drain 316.

Referring to FIG. 3F, the stop layer 328 exposed by the opening 342, and the dielectric layer 326 and the dielectric layer 320 underneath the exposed stop layer 328, are removed by an anisotropic etching process, for example, reactive ion etch using the mask layer 340 as an etch mask to form the node contact opening 344. The mask layer 340 is then removed, so that the dual damascene opening 346 is formed.

Figure 3G:
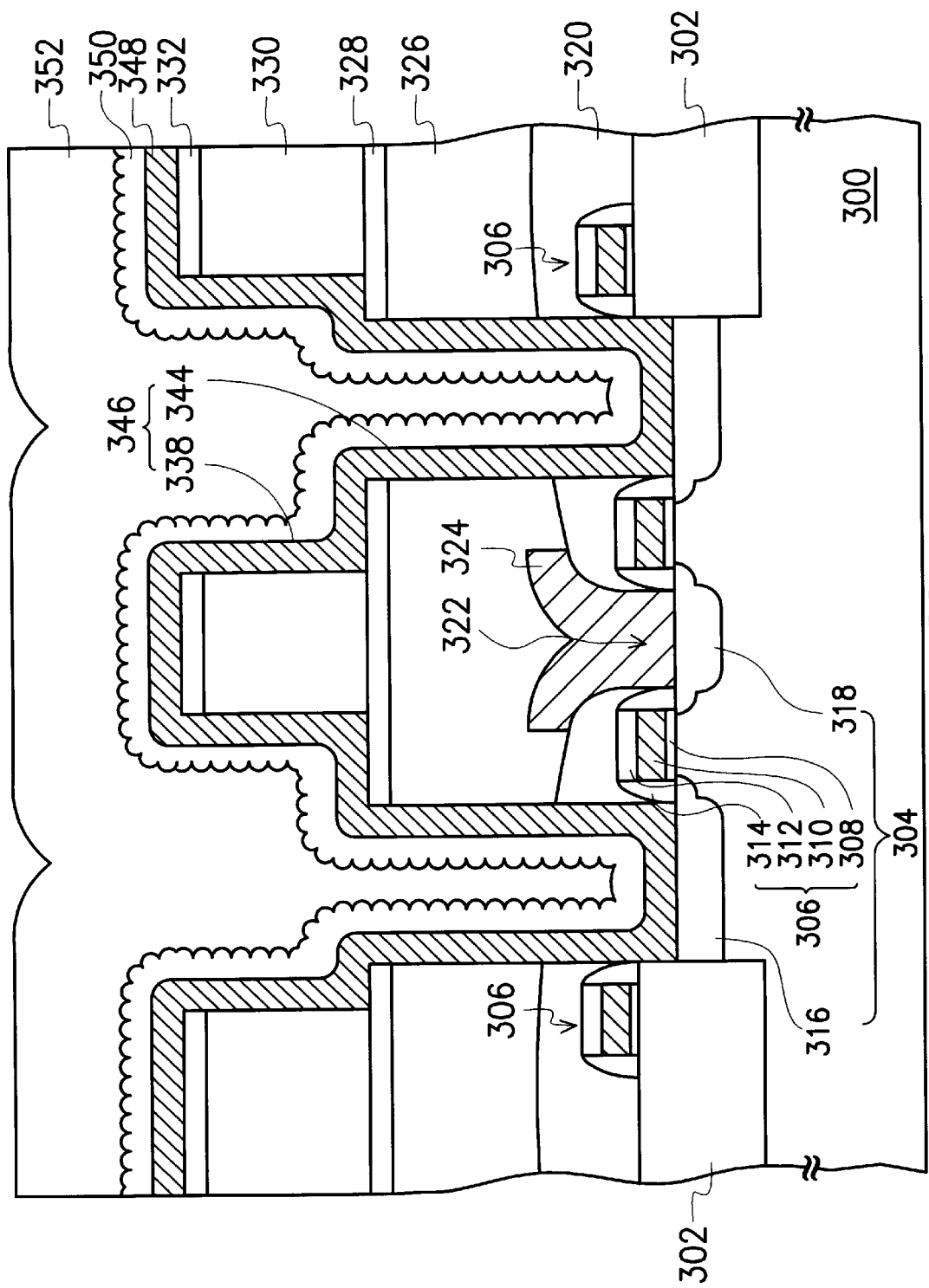

Referring to FIG. 3G, a conducting layer 348 is formed, which covers the protecting layer 332 and the surface of the dual damascene opening 346, for use as the bottom plate. A material of the conducting layer 348 comprises doped polysilicon. Preferably, a hemispherical-grained silicon layer 350 is formed on the conducting layer 348 formed from doped polysilicon to increase the effective area of the bottom plate. The doped polysilicon layer is formed by, for example, chemical vapor deposition to a thickness of about 500 Angstroms to 1000 Angstroms, while the hemispherical-grained silicon layer 350 is formed by, for example, chemical vapor deposition to a thickness of about 500 Angstroms to 1000 Angstroms.

Referring to FIG. 3G, a dielectric layer 352 is formed to cover the hemispherical-grained silicon layer 350 and to fill the remaining space of the dual damascene opening 346. The dielectric layer 352 has a polishing rate that is different from the polishing rate of the protecting layer 332. A material of the dielectric layer 352 is, for example, silicon oxide formed by chemical vapor deposition or low-pressure chemical vapor deposition.

Figure 3H:
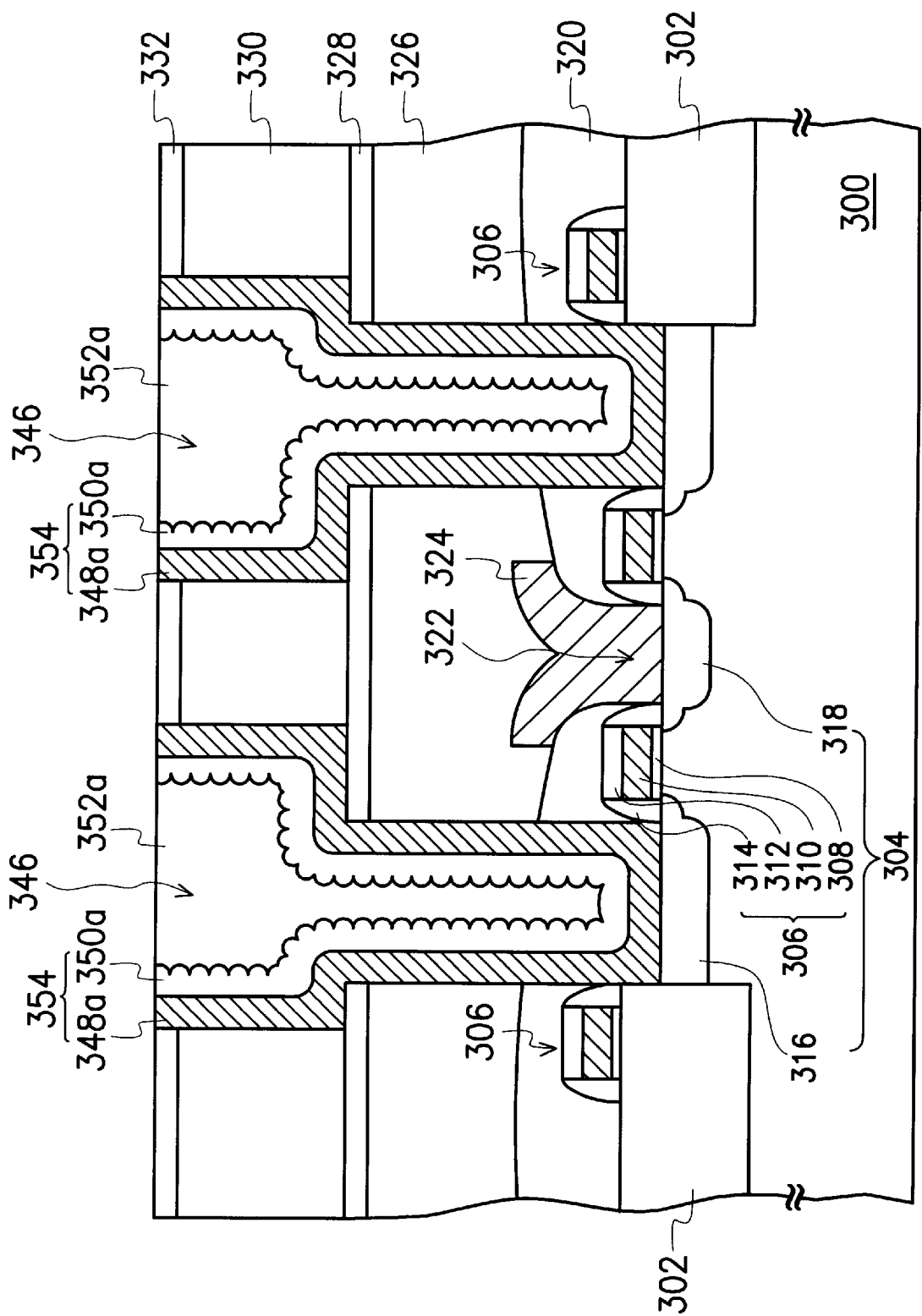

Referring to FIG. 3H, the conducting layer 348, the hemispherical-grained silicon layer 350 and the dielectric layer 352 over the surface of the protecting layer 332 are removed, preferably by, for example, chemical mechanical polishing while using the protecting layer 332 as polishing stop layer. The conducting layer 348a, the hemispherical-grained silicon layer 350a and the dielectric layer 352a within the dual damascene opening 346 are left, and the protecting layer 332 is exposed, wherein the remaining conducting layer 348a and the hemispherical-grained silicon layer 350a are used as the bottom plate 354.

Figure 3I:
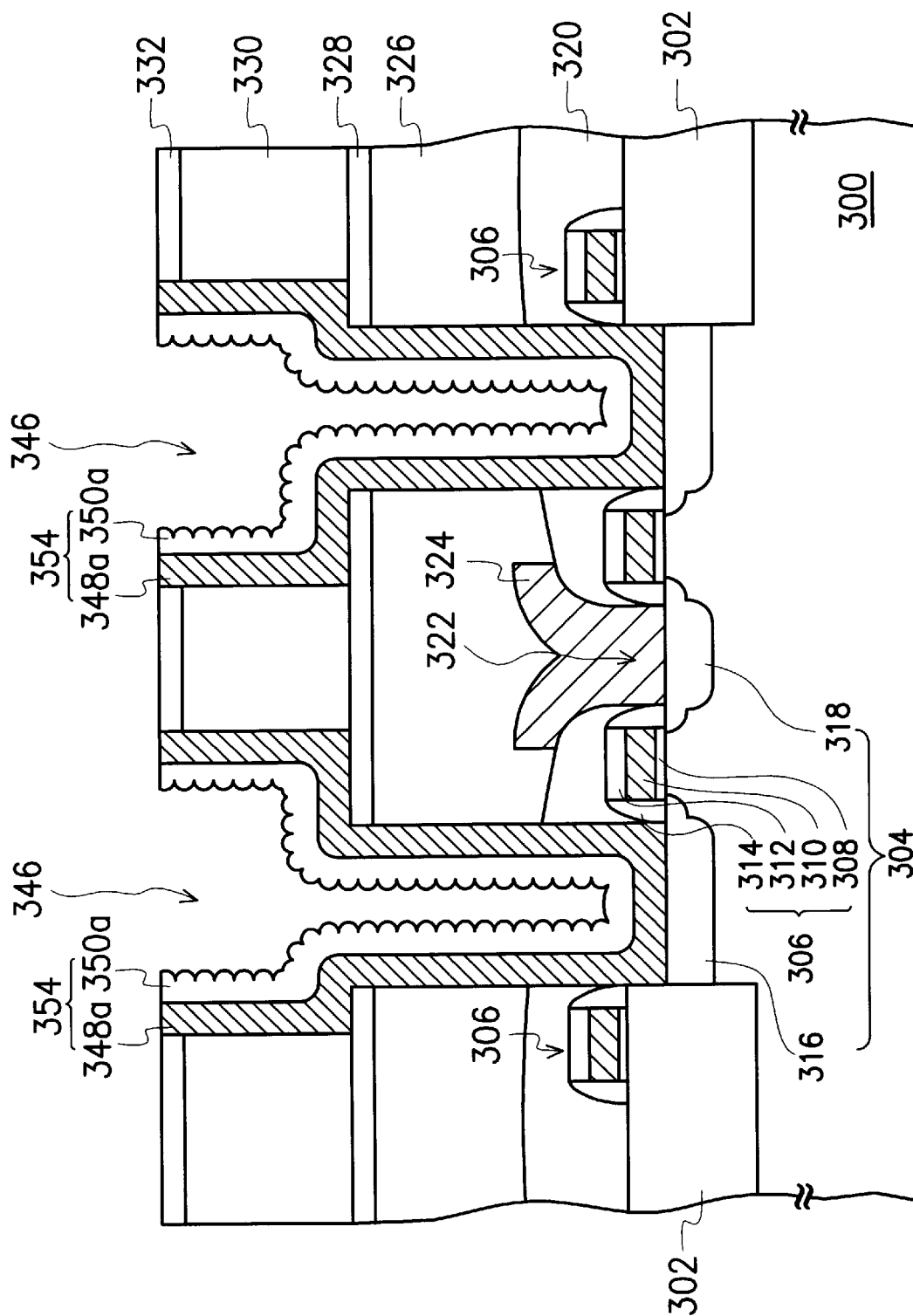

Referring to FIG. 3I, the remaining dielectric layer 352a in the dual damascene opening 346 is removed by, for example, a wet etching process to expose the surface of the hemispherical-grained silicon layer 350 of the bottom plate 354. The wet etching process is performed by a buffer oxide etchant, a dilute hydrofluoric acid etchant, or like etchants. The protecting layer 332 protects the dielectric layer 330 underneath to prevent it from suffering damage during the etching process.

In the present invention, after the hemispherical-grained silicon layer 350 is formed, the conducting layer 348 and the hemispherical-grained silicon layer 350 over the surface of the protecting layer 332 are not removed by chemical mechanical polishing to form the bottom plates which are separated etch other. Rather, the polishing process is performed after the dual damascene opening 346 is filled with dielectric layer 352. The conducting layer 348 and hemispherical-grained silicon layer 350 can be supported by the dielectric layer 352 during the polishing process, so that the conducting layer 348 and the hemispherical-grained silicon layer 350 can avoid toppling over.

The bottom plates 354 of the present invention are formed in the dual damascene opening 346. The bottom plates 352 are separated from each other by chemical mechanical polishing that replaces the conventional patterning method of photolithography and etching. Problems, such as misalignment arising from photolithography, can be avoided. The difficult etching problem, arising from the conducting layer used for forming the bottom plate being too thick and the spaces of the bottom plate being narrow, is resolved.

Figure 3J:
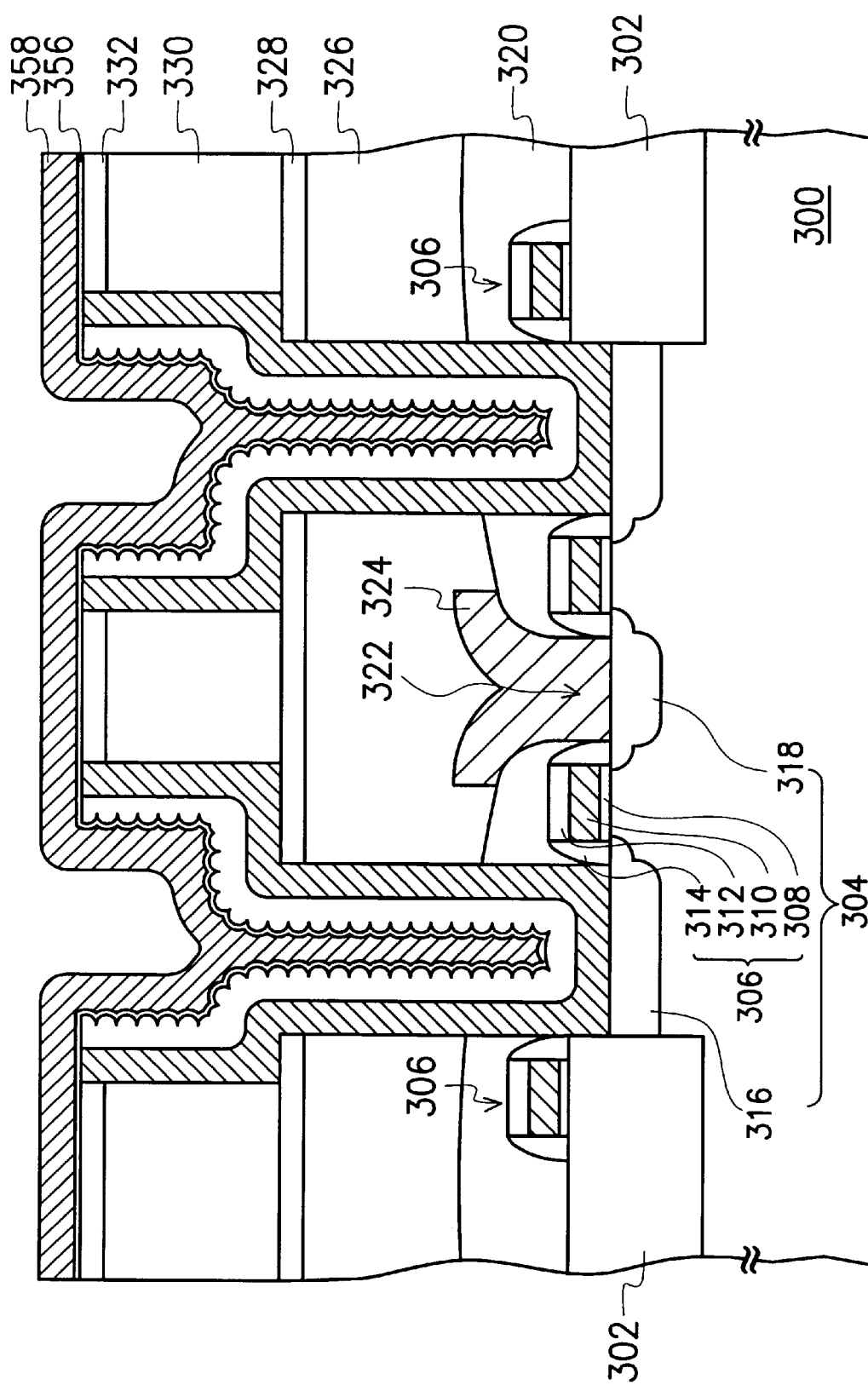

Referring to FIG. 3J, a capacitor dielectric layer 356 is formed over the substrate 300. A material of the capacitor dielectric layer 356 comprises, for example, oxide/nitride/oxide formed by low-pressure chemical vapor deposition. Preferably, a pre-cleaning process is performed by, for example, a buffer oxide etchant, a dilute hydrofluoric acid etchant, or like etchants before forming the capacitor dielectric layer 356. After the capacitor dielectric layer 356 is formed, a conducting layer 358 is formed thereon for use for the top plates of the capacitor. The conducting layer 358 comprises a doped polysilicon layer formed by chemical vapor deposition. The second embodiment Another method of the present invention for fabricating a dynamic random access memory can be performed in advance by the processes as shown in FIG. 3A to FIG. 3H. The stop layer 328, the dielectric layer 330 and the protecting layer 332 are formed on the substrate 300 and the dual damascene openings 346 are formed therein. The conducting layer 348 and the hemispherical-grained silicon layer 350 are formed over the protecting layer 332 and within the dual damascene opening 346, and then the remaining spaces of the dual damascene opening 346 are filled with dielectric layer 302. A chemical mechanical polishing is performed to remove the dielectric layer 352, the hemispherical-grained silicon layer 350, and the conducting layer 348 over the surface of the protecting layer 332. The dielectric layer 352a, the hemispherical-grained silicon layer 350a, and the conducting layer 348a are left in the dual damascenes 346.

Figure 4A:
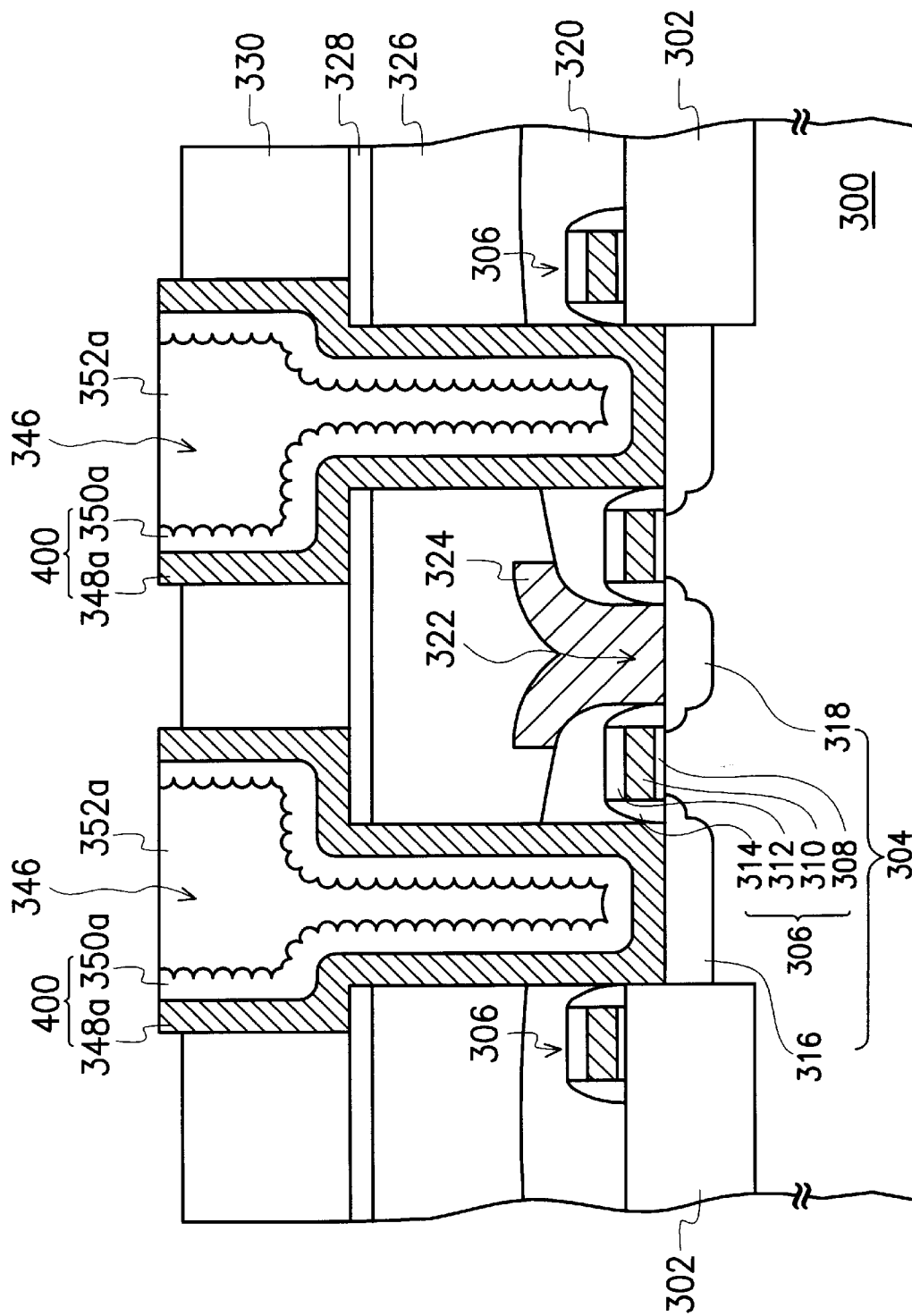
FIGS. 4A–4C are schematic, cross-sectional views illustrating a method of fabricating a DRAM according to the second preferred embodiment of the method according to the present invention.

Referring to FIG. 4A, the protecting layer 332 is removed by a wet etching process to expose the surface of the dielectric layer 330. The preferable wet etching process is performed using a hot phosphorous acid etchant as the protecting layer 332 is formed from silicon nitride.

Figure 4B:
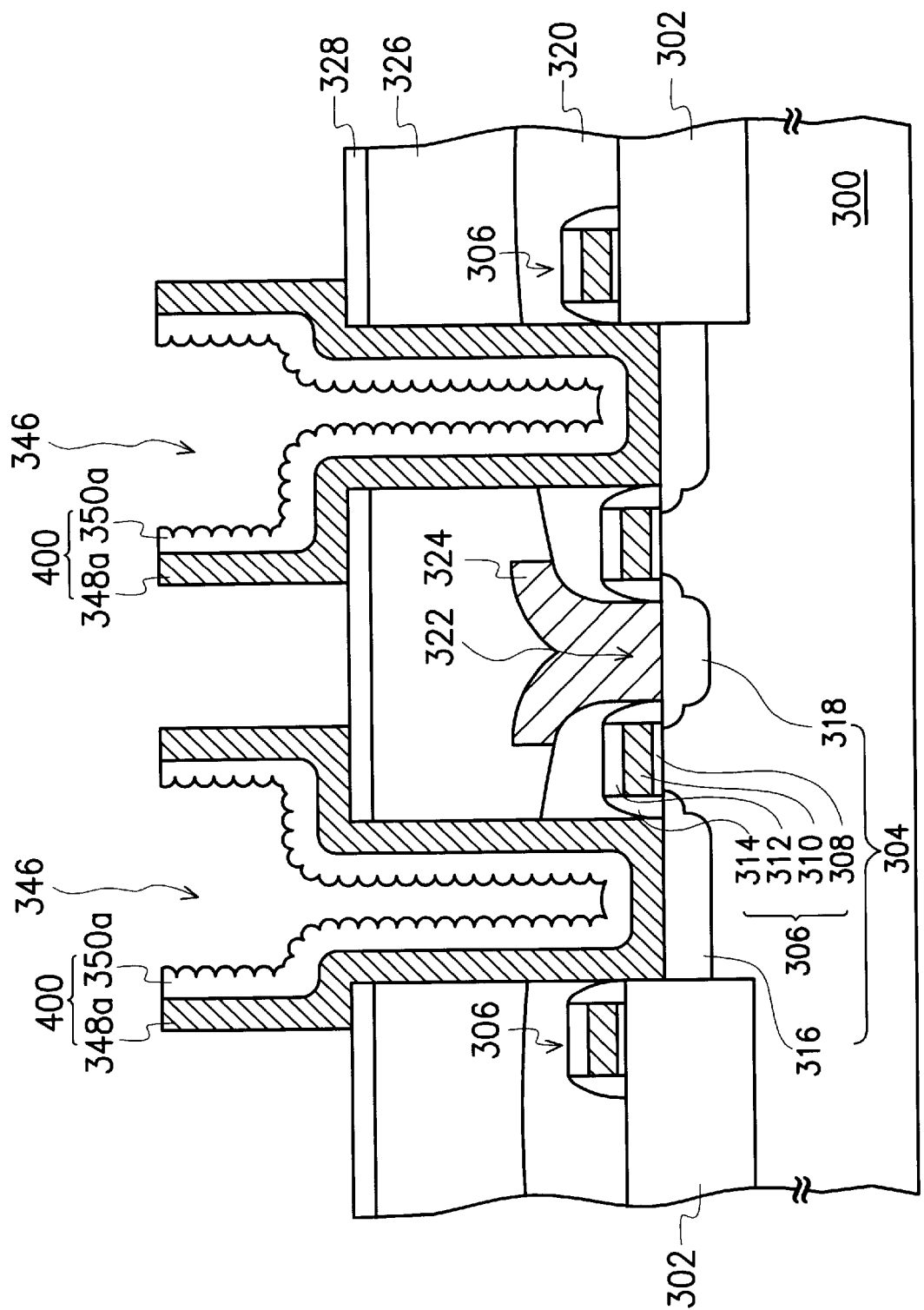

Referring to FIG. 4B, the dielectric layer 352a and the dielectric layer 330 are removed by, for example, a wet etching process to expose the surface of the conducting layer 348a and the surface of the hemispherical-grained silicon layer 350a. The exposed conducting layer 348a and hemispherical-grained silicon layer 350a are used for the bottom plate 400 of the capacitor. The bottom plate 400 increase the surface of the conducting layer 348a on the sidewalls of the dual danascenes 346, so that the bottom plate 400 of the second embodiment has more effective areas than the bottom plate 354 of the first embodiment as shown in FIG. 3I. The capacitance of the capacitor can be improved. The wet etching process is performed by, for example, a buffer oxide etchant, a dilute hydrofluoric acid etchant, or like etchants. The stop layer 328 protects the dielectric layer 326 and the dielectric layer 320 to prevent them from suffering damage during the wet etching process.

Figure 4C:
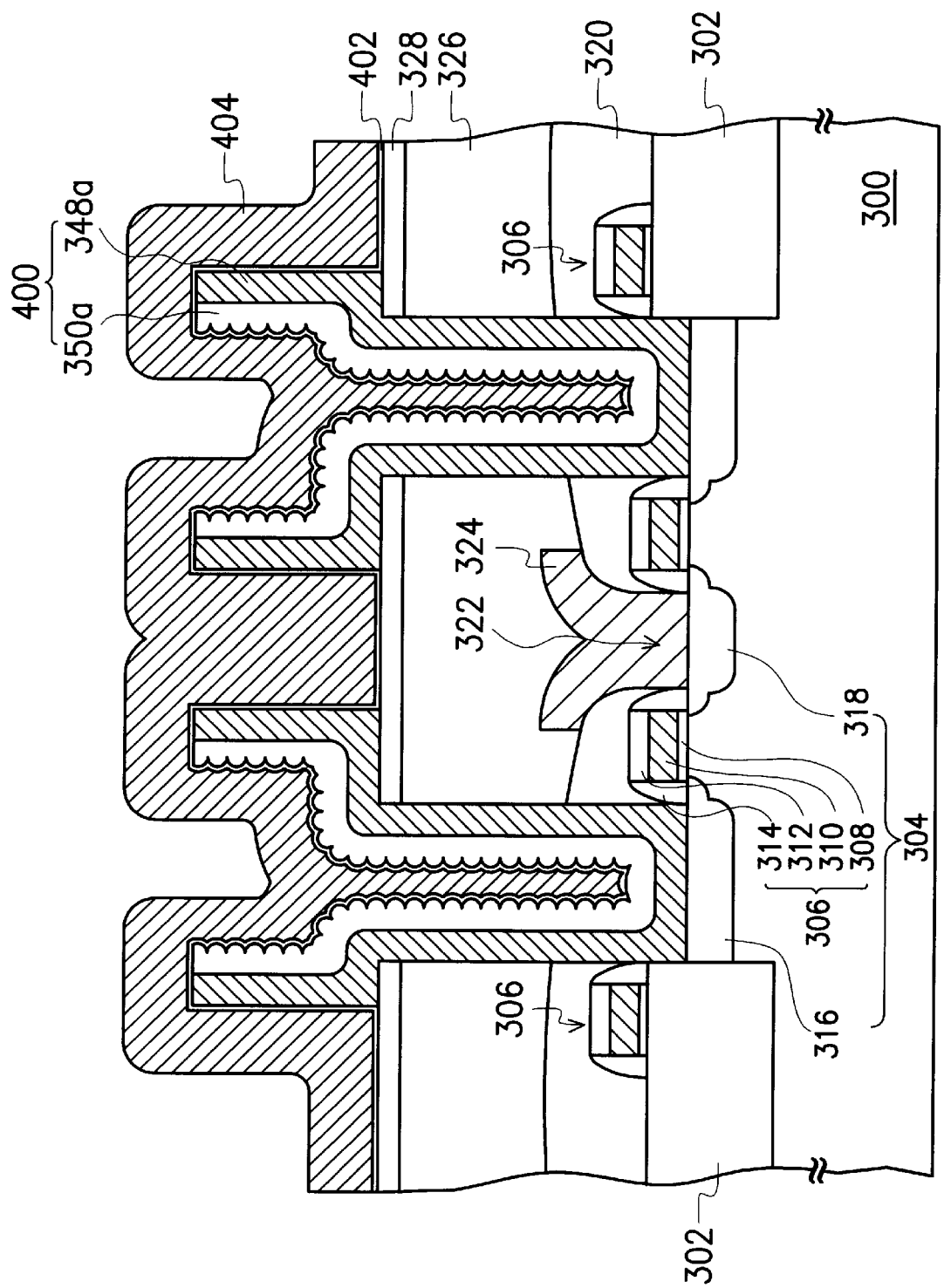

Referring to FIG. 4C, a capacitor dielectric layer 402 is formed on the bottom plate 400, wherein the capacitor dielectric layer 402 is located between the bottom plate 400 and the top plate. A material of the capacitor dielectric layer 402 comprises, such as, an oxide/nitride/oxide stack structure formed by, for example, low-pressure chemical vapor deposition. Preferably, a pre-cleaning process is performed by, for example, a buffer oxide etchant, a dilute hydrofluoric acid etchant, or like etchants before forming the capacitor dielectric layer 402. After the capacitor dielectric layer 402 is formed, a conducting layer 402 is formed thereon for use as the top plate of the capacitor. The conducting layer 402 comprises a doped polysilicon layer formed by chemical vapor deposition.

In the present invention, the node contact opening and the capacitor opening are combined in a step of the dual damascene opening process during capacitor formation. The bottom plate of the capacitor is embedded in the dual damascene opening. The conducting layer used for forming the bottom plates is polished by chemical mechanical polishing to form the bottom plates that are separated each other, so that patterning of bottom plate by photolithography and etching is not necessary in the present invention. Problems, such as, misalignment arising from photolithography can be avoided. The difficult etching problem, arising from the conducting layer used for forming the bottom plate being too thick and the spaces of the bottom plate being too narrow, is resolved. The processes of the present invention are simplified, so that the present invention is more cost effective and has a high yield potential. The layout rule for all capacitors-related layers can be relaxed significantly, so that the present invention makes a high density array design and process control easy to attain.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a dynamic random access memory, comprising:

providing a substrate;

forming a gate on the substrate;

forming a first source/drain and a second source/drain in the substrate;

forming a first dielectric layer over the substrate;

forming a bit line in the first dielectric layer to connect to the first source/drain;

sequentially forming a planted second dielectric layer, a stop layer, a third dielectric layer and a protecting layer over the substrate;

forming a dual damascene opening in the protecting layer, the third dielectric layer, the stop layer, the planted second dielectric layer and the first dielectric layer, wherein the dual damascene opening exposes the second source/drain;

forming a first conformal conducting layer which covers a surface of the dual damascene opening and a surface of the protecting layer;

forming a fourth dielectric layer on the substrate to cover the first conformal conducting layer and to fill the dual damascene opening;

polishing the conformal first conducting layer and the fourth dielectric layer on a surface of the protecting layer with a chemical mechanical polishing process, using the protecting layer as a polishing stop layer;

removing the fourth dielectric layer remaining in the dual damascene opening;

forming a capacitor dielectric layer on the first conformal conducting layer; and forming a second conducting layer on the capacitor dielectric layer and patterning the second conducting layer.

2. The method as claimed in claim 1, wherein the steps of forming the dual damascene opening comprise:

forming a first mask layer on the protecting layer, wherein the first mask layer has a first opening over the second source/drain;

removing the protecting layer exposed the first opening and a portion of the third dielectric layer under the protecting layer to forming a capacitor opening, which exposes a part of a surface of the stop layer;

removing the first mask layer;

forming a second mask layer over the substrate, the second mask layer having a second opening over the second source/drain, wherein the second opening exposes a part of the surface of the stop layer;

removing the stop layer exposing the second opening, and removing a portion of the second dielectric layer and a portion of the first dielectric layer which are under the stop layer to form a node contact opening, which exposes the second source/drain; and removing the second mask layer.

3. The method as claimed in claim 2, wherein the steps of removing the protecting layer exposing the first opening and the portion of the third dielectric layer under the protecting layer to forming the capacitor opening comprise a reactive ion etching process.

4. The method as claimed in claim 2, wherein the steps of removing the stop layer exposing the second opening, and removing the portion of the second dielectric layer and the portion of the first dielectric layer which are under the stop layer, comprise a reactive ion etching process.

5. The method as claimed in claim 1, wherein an etching rate of the stop layer is different from etching rates of the first dielectric layer, the second dielectric layer, and the third dielectric layer.

6. The method as claimed in claim 5, wherein a material of the stop layer comprises silicon nitride.

7. The method as claimed in claim 1, wherein a polishing rate of the stop layer is different from polishing rates of the fourth dielectric layer and the conformal first conducting layer.

8. The method as claimed in claim 7, wherein a material of the protecting layer comprises silicon nitride, and a material of the fourth dielectric layer comprises silicon oxide.

9. The method as claimed in claim 1, wherein a material of the first conformal conducting layer comprises doped polysilicon.

10. The method as claimed in claim 9, further comprising forming a hemispherical-grained silicon layer on the first conformal conducting layer.

11. A method of fabricating a dynamic random access memory, comprising:

providing a substrate;

forming a gate on the substrate;

forming a first source/drain and a second source/drain in the substrate;

forming a first dielectric layer over the substrate;

forming a bit line in the first dielectric layer to connect to the first source/drain;

sequentially forming a planted second dielectric layer, a stop layer, a third dielectric layer and a protecting layer over the substrate;

forming a dual damascene opening in the protecting layer, the third dielectric layer, the stop layer, the planted second dielectric layer and the first dielectric layer, wherein the dual damascene opening exposes the second source/drain;

forming a first conformal conducting layer which covers a surface of the dual damascene opening and a surface of the protecting layer;

forming a fourth dielectric layer on the substrate to cover the first conformal conducting layer and to fill the dual damascene opening;

polishing the conformal first conducting layer and the fourth dielectric layer on a surface of the protecting layer with a chemical mechanical polishing process, using the protecting layer as a polishing stop layer;

removing the protecting layer;

removing the fourth dielectric layer remaining in the dual damascene opening;

removing the remaining third dielectric layer to expose the conformal first conducting layer;

forming a capacitor dielectric layer on the first conformal conducting layer; and forming a second conducting layer on the capacitor dielectric layer and patterning the second conducting layer.

12. The method as claimed in claim 11, wherein the steps of forming the dual damascene opening comprise:

forming a first mask layer on the protecting layer, wherein the first mask layer has a first opening over the second source/drain;

removing the protecting layer exposed in the first opening and a portion of the third dielectric layer under the protecting layer to forming a capacitor opening, which exposes a part of a surface of the stop layer;

removing the first mask layer;

forming a second mask layer over the substrate, the second mask layer having a second opening over the second source/drain, wherein the second opening exposes a part of the surface of the stop layer;

removing the stop layer exposed in the second opening, and removing a portion of the second dielectric layer and a portion of the first dielectric layer which are under the stop layer to form a node contact opening, which exposes the second source/drain; and removing the second mask layer.

13. The method as claimed in claim 12, wherein the steps of removing the protecting layer exposed the first opening and the portion of the third dielectric layer under the protecting layer to forming the capacitor opening comprise a reactive ion etching process.

14. The method as claimed in claim 12, wherein the steps of removing the stop layer exposed in the second opening, and removing the portion of the second dielectric layer and the portion of the first dielectric layer which are under the stop layer comprise a reactive ion etching process.

15. The method as claimed in claim 11, wherein an etching rate of the stop layer is different from etching rates of the first dielectric layer, the second dielectric layer, and the third dielectric layer.

16. The method as claimed in claim 15, wherein a material of the stop layer comprises silicon nitride.

17. The method as claimed in claim 11, wherein a polishing rate of the stop layer is different from polishing rates of the fourth dielectric layer and the conformal first conducting layer.

18. The method as claimed in claim 17, wherein a material of the protecting layer comprises silicon nitride, and a material of the fourth dielectric layer comprises silicon oxide.

19. The method as claimed in claim 11, wherein a material of the first conformal conducting layer comprises doped polysilicon.

20. The method as claimed in claim 19, further comprising forming a hemispherical-grained silicon layer on the first conformal conducting layer.

* * * * *